United States Patent
Katsap et al.

(10) Patent No.: US 6,620,565 B2
(45) Date of Patent: Sep. 16, 2003

(54) ELECTRON BEAM LITHOGRAPHY APPARATUS FOCUSED THROUGH SPHERICAL ABERRATION INTRODUCTION

(75) Inventors: Victor Katsap, Belle Mead, NJ (US); Eric Munro, London (GB); John Andrew Rouse, Surrey (GB); Warren K. Waskiewicz, Clinton, NJ (US); Xieqing Zhu, London (GB)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/188,030

(22) Filed: Jul. 3, 2002

(65) Prior Publication Data

US 2003/0022077 A1 Jan. 30, 2003

Related U.S. Application Data

(62) Division of application No. 09/679,403, filed on Oct. 4, 2000, now Pat. No. 6,440,620.

(30) Foreign Application Priority Data

Sep. 4, 2000 (EP) ............................................. 00307641

(51) Int. Cl.[7] .............................. G03F 9/00; A61N 5/00
(52) U.S. Cl. ......................... 430/30; 430/296; 430/942; 250/492.3
(58) Field of Search ...................... 430/30, 296, 942; 250/492.3

(56) References Cited

U.S. PATENT DOCUMENTS 4,710,639 A    12/1987   Sawaragi ................. 250/492.2
5,079,112 A   *   1/1992   Berger et al. ................ 430/296

OTHER PUBLICATIONS

Mkrtchyan, M. et al., "Global space charge effect in Scalpel," Microelectronic Engineering 53, Jun. 2000, pp. 299–302.
Zhu, Xieqing et al., "Aberration compensation in charged particle projection lithography," Nuclear Instruments and Methods in Physics Research A 427 (1999), pp. 292–298.
European Search Report dated Mar. 1, 2001.

* cited by examiner

*Primary Examiner*—Christopher G. Young
(74) *Attorney, Agent, or Firm*—Harness, Dickey & Pierce, P.L.C.

(57) ABSTRACT

An apparatus and method of focusing including a source for producing an electron beam, a mask and a projection column, through which the electron beam passes, and a wafer on which the electron beam is to be focused. The wafer is located in a plane where spherical aberrations of the projection column reduce the negative defocusing effect caused by chromatic aberrations in the projection column. The apparatus and method are applicable to general electron patterning tools, electron patterning tools where a thickness of the mask is smaller than an electron mean free path of the electron patterning tool, and the SCALPEL™ electron patterning tool.

10 Claims, 14 Drawing Sheets

ELECTRON BEAM LITHOGRAPHY APPARATUS FOCUSED THROUGH SPHERICAL ABERRATION INTRODUCTION

This U.S. non-provisional application is a divisional of U.S. application Ser. No. 09/679,403, now U.S. Patent No. 6,440,620, filed on Oct. 4, 2000, and claims priority under 35 U.S.C. §119 to European Patent Application No. 00307641.1, filed on Sep. 4, 2000.

BACKGROUND OF THE INVENTION

1. Field of the Invention

The invention is generally directed to electron patterning, and more particularly electron patterning using scatter-nonscatter masking and even more particularly electron patterning in accordance with the SCALPEL process described in U.S. Pat. No. 5,079,112, issued Jan. 7, 1992. The present invention is also applicable to ion patterning.

2. Description of the Related Art

Figure 1:
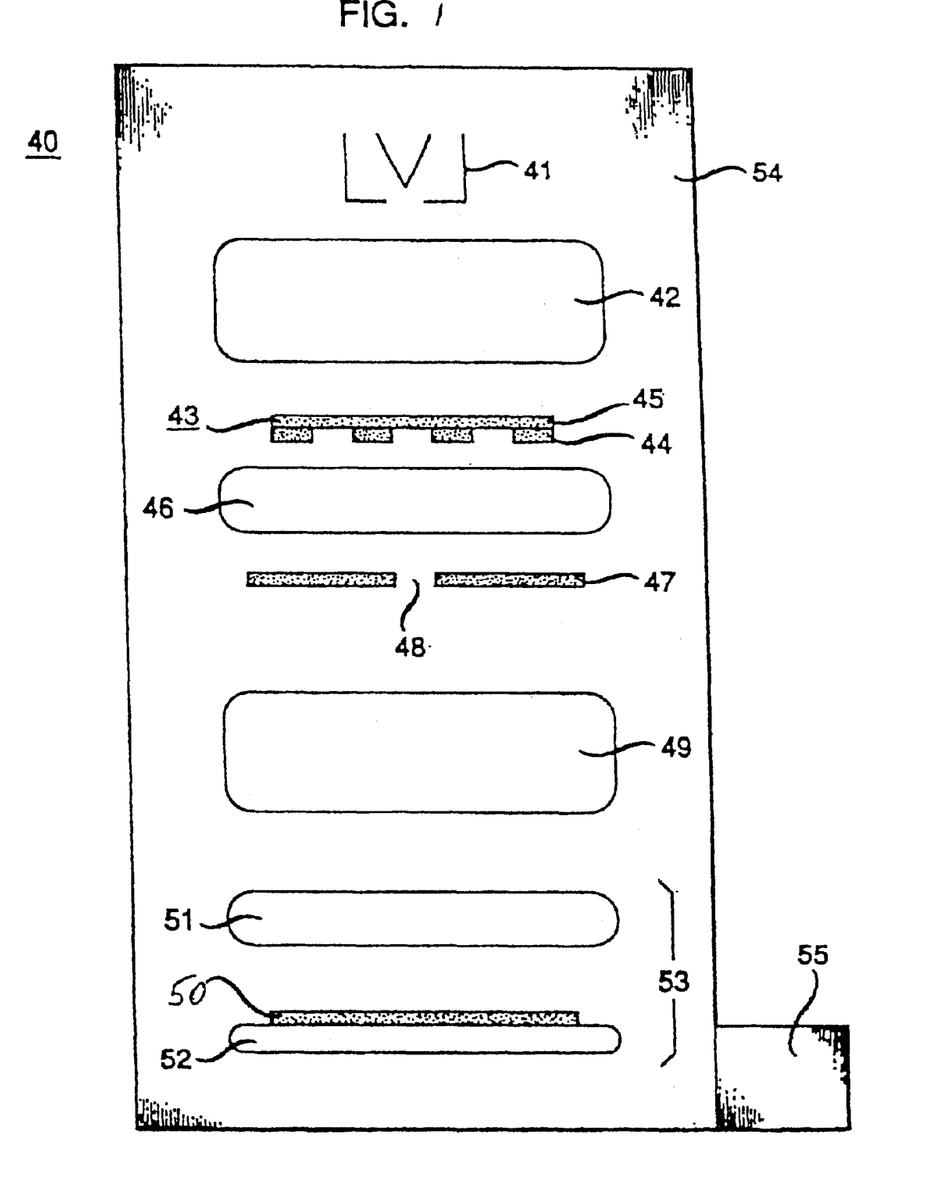
FIG. 1 illustrates a first conventional electron patterning apparatus arrangement.

An exemplary conventional apparatus 40 depicted in FIG. 1 includes an electron or other energy source 41, condenser lens system 42, mask 43 including blocking regions 44 and transparent regions 45, objective lens 46, back focal plane filter 47 shown as provided with on-axis aperture 48, projector lens system 49, exposure medium 50, between lens 51 and stage 52, which together constitute registration and alignment system 53. The apparatus 40 is completed by vacuum chamber 54 and air lock 55, the latter providing the specimen exchange.

Figure 2:
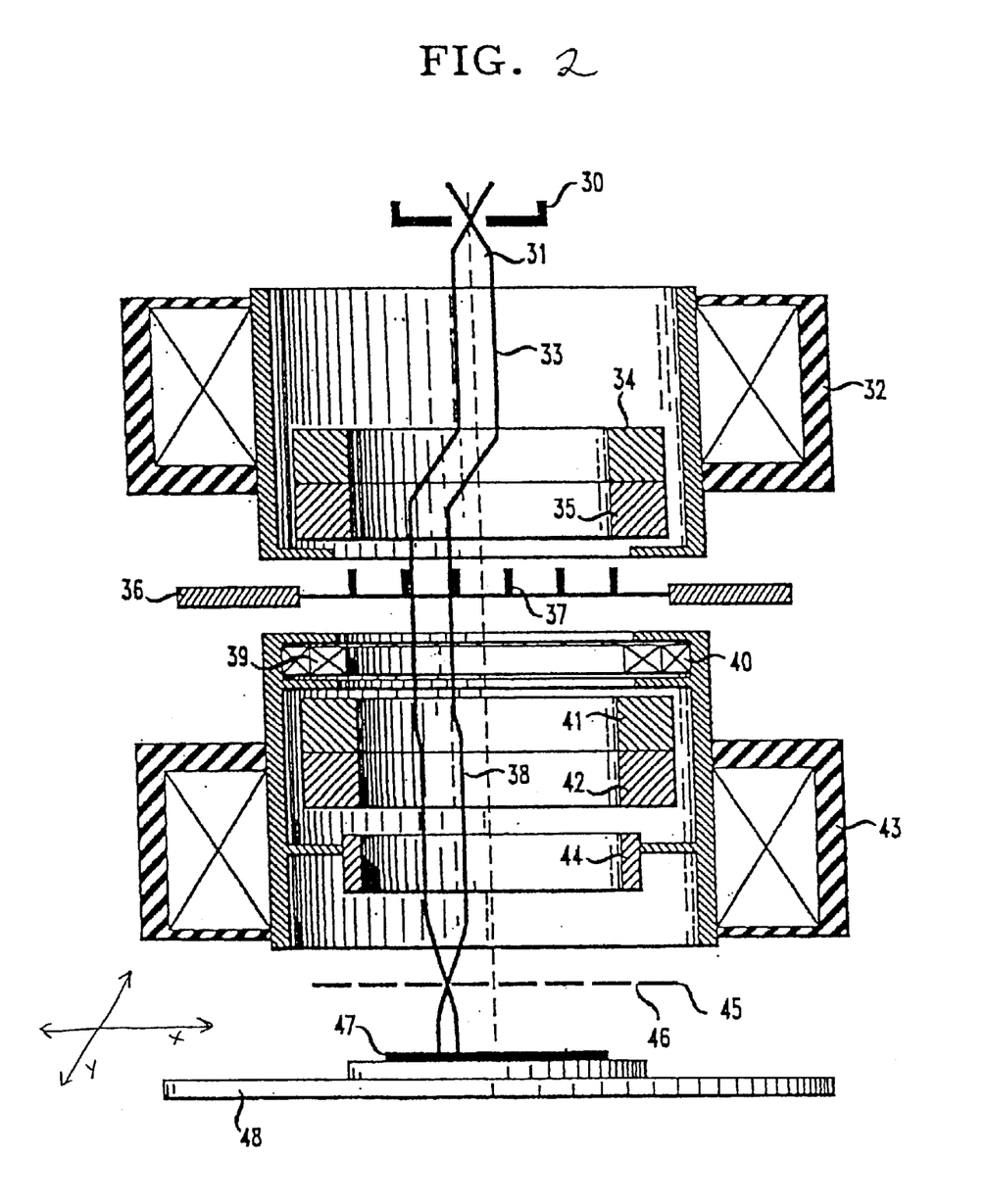
FIG. 2 illustrates a second conventional electron patterning apparatus arrangement.

Another conventional apparatus shown in FIG. 2 includes a particle source 30, illustrated as an electron gun, delivering electron beam 31. Collimator lens 32 brings the initially diverging rays into parallel relationship at 33 as shown. Scan deflectors 34 and 35 are responsible for electronic scanning, e.g. with continuous x-direction scanning. The second deflector provides for y-direction movement, either continuous or as stepped intermediate x-direction scans. Mask 36, as depicted again in exemplary terms, is shown as segmented by struts 37. Upon passing through the mask, the now pattern-containing beam 38, comes under the influence of dynamic focus and stigmator deflectors 39 and 40. Deflectors 41 and 42 provide for a precision in placement of adjoining regions during x- and y-electronic scanning/stepping.

Projection lens 43 is provided with variable axis deflector 44. The multiple aperture filter 45 including apertures 46 produces a focused image on wafer 47 shown atop wafer stage 48. As discussed, for illustrative purposes, mask 36 is shown as constituted of pattern regions corresponding with strut-separated segments. Following modulation which imparts patterning information on the beam during passage through mask 36, the beam is converged, finally reaching a crossover (or image inversion) on or near the plane defined by aperture filter 46. The aperture filter 45 is included for electron imaging for blocking unwanted scattered radiation. It may serve, as well, to block other "noise"—e.g. by blocking unwanted feature-edge scattered radiation. Aperture 46 may define the numerical aperture (or pupil) of the system.

The apparatus of FIG. 1 has separate condenser and projector lens systems. This may be preferred to facilitate focusing with minimum mechanical adjustment. There may be a further preference for multiple lenses in the projector system. For example, use of three lenses is useful to allow correction for image distortion and other aberrations, and to control image rotation as well.

The exemplary, conventional projector lenses 49, 43 may include other elements, e.g. may include a doublet of two optically equivalent lenses, in operation oppositely polarized to inherently cancel corresponding aberrations implicit to design or operation common to the two. Consistent with usual practice, the hardware responsible for generation of the functional shaped field is, itself, referred to as the "lens".

In FIG. 2, lenses 39 and 40 perform dynamic correction for aberration as well as for focusing, e.g. correcting for wafer height variation as well as field curvature. Assigning responsibility for dynamic adjustment to these lenses speeds the process by lessening inductive lag time. For example, dynamic aberration correction may entail additional deflectors compensating for errors resulting from equipment/process defects. Lenses 39 and 40 are illustrative and they may include additional elements.

Figure 3:
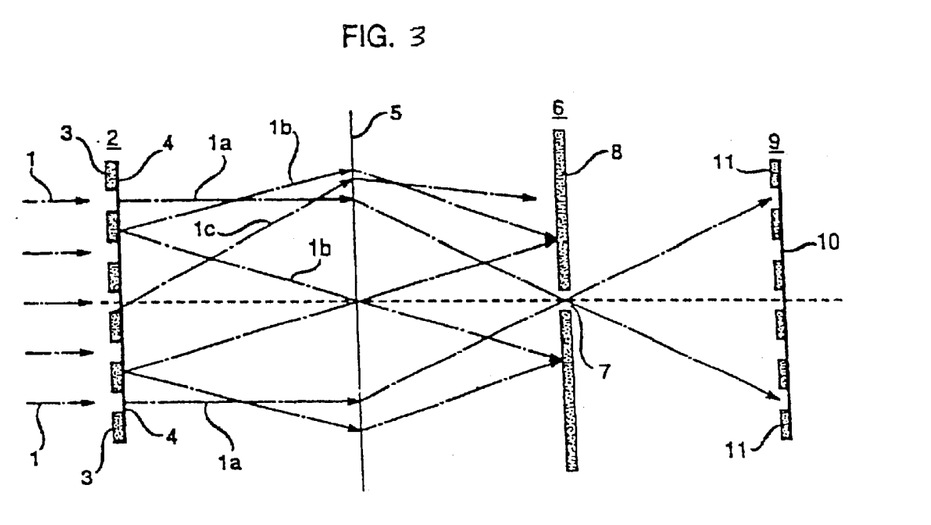
FIGS. 3–4 illustrate exemplary conventional optics in FIGS. 1–2.
Figure 4:
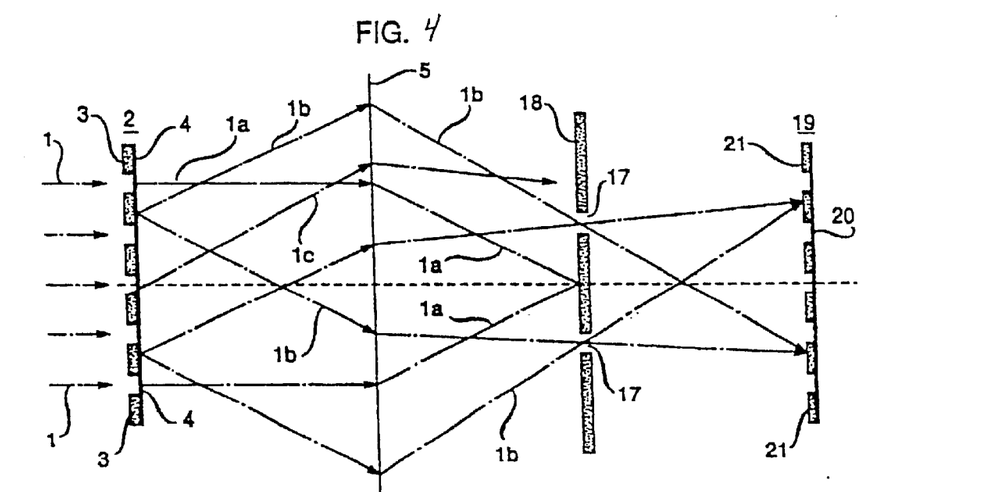

FIGS. 3 and 4 illustrate systems with exemplary optics. FIGS. 3 and 4 discussed below illustrate schematics serving as a basis for discussing the fundamental principles involved in conventional electron patterning.

The conventional single lens system depicted in FIG. 3 makes use of beam electrons, or other delineating energy, identified as rays 1 incident on mask 2 which includes blocking regions 3 and transparent regions 4. Rays transmitted through transparent regions 4, are identified as rays 1a while those transmitted by blocking regions 3 are identified as rays 1b. Such rays are refracted by lens 5 with emerging rays made incident on back focal plane filter 6. As schematically depicted rays 1a pass through filter aperture 7 to result in image 9 including replicated illuminated regions 10 and unilluminated regions 11. Rays 1b scattered beyond a critical scattering angle, do not pass through aperture 7, but instead are absorbed or otherwise blocked by the non-apertured portion 8 of filter 6.

A conventional system in which scattered energy is selectively used to form the image is illustrated in FIG. 4. Here, scattered rays 1b pass through apertures 17 while transmitted rays 1a are now stopped by filter region 18. Image 19 a negative of image 9, results from selective illumination of regions 21. Regions 20 are unilluminated. In this arrangement, the back focal plane filter is absorbing although alternative designs may make use of forms of scattering such as Bragg scattering, etc.

Generally the projection system(s) illustrated in FIGS. 1–4 perform mask-to-wafer demagnification, on the order of 4:1–5:1. They are equally applicable to 1:1 and other magnification ratios.

Figure 5:
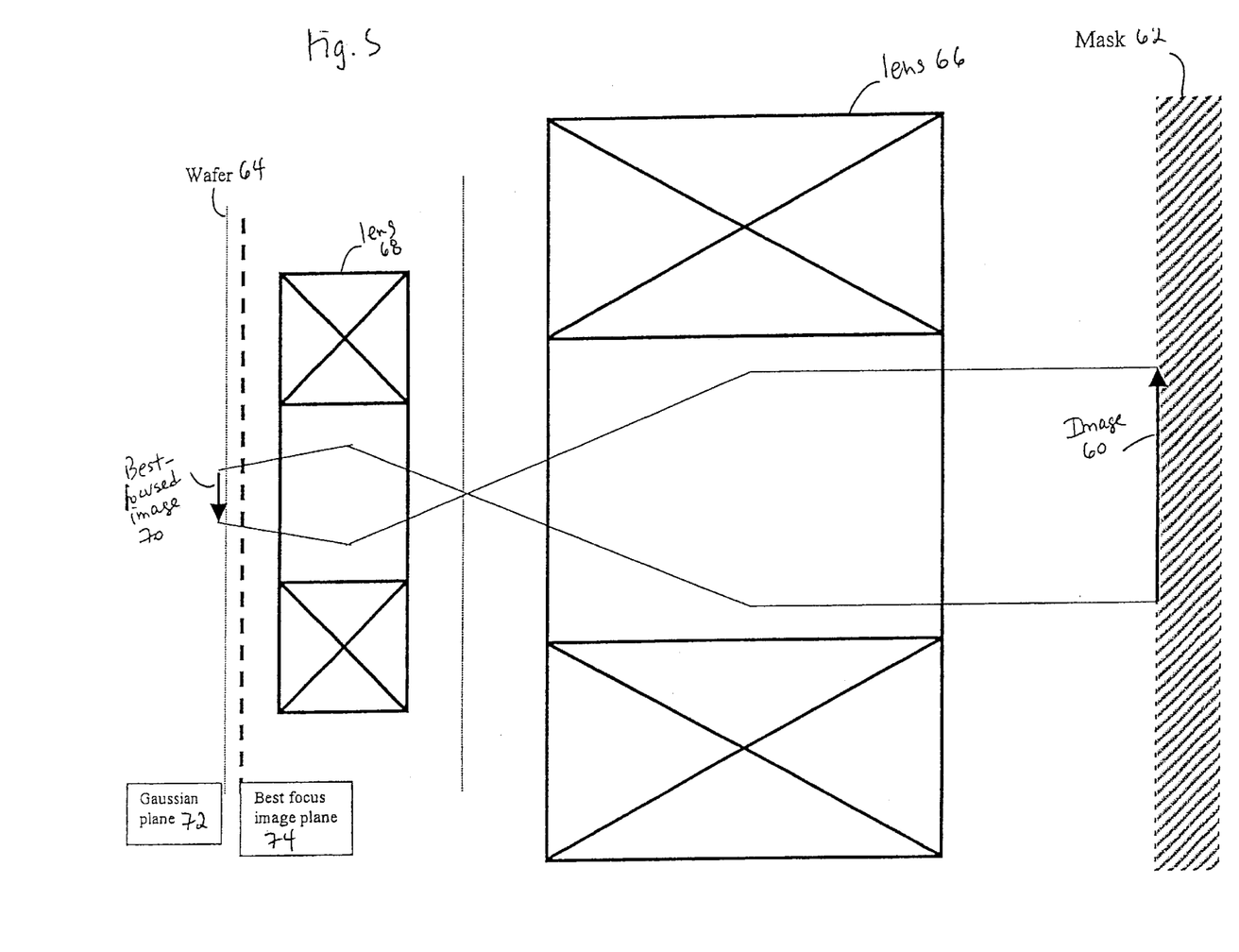
FIG. 5 illustrates a third conventional electron patterning system.

Generally, systems illustrated in FIGS. 1–4 are arranged so that the resulting image on the wafer is focused as well as possible. As illustrated in a simplified system of FIG. 5, the goal is to focus the image 60 at the mask 62 on the wafer 64. Assuming the lens doublet 66, 68 as illustrated in FIG. 5 includes no aberrations, the best focused image 70 occurs at the Gaussian plane 72. However, due to several types of aberration, the most significant being chromatic and spherical aberrations, present in the lens doublet 66, 68, the best focused image plane 74 usually does not coincide with the Gaussian plane 72. Conventional techniques for determining the best focused image plane 74 have concentrated on separately analyzing the effect of chromatic and spherical aberrations on the location of the best focused image plane. These techniques are discussed below.

A conventional technique for estimating beam focus quality is a point spread function (PSF). Typically this includes launching up to 5000 trajectories' from a single point at the center of the mask 62 plane and studying individual trajectories arrival points at the center of the wafer 64 plane.

Typical initial launch conditions included electrons' angular distribution resulting in landing angles up to 12 mrad (up to 10 mrad, or up to 8 mrad), and electrons' actual energy distribution. The latter have been obtained experimentally by analyzing electrons' energy spread before and after passing through a mask 62 (silicon nitride $Si_xN_y$, 0.1 μm thick). An exemplary electron energy distribution is shown in FIG. 6.

Figure 6:
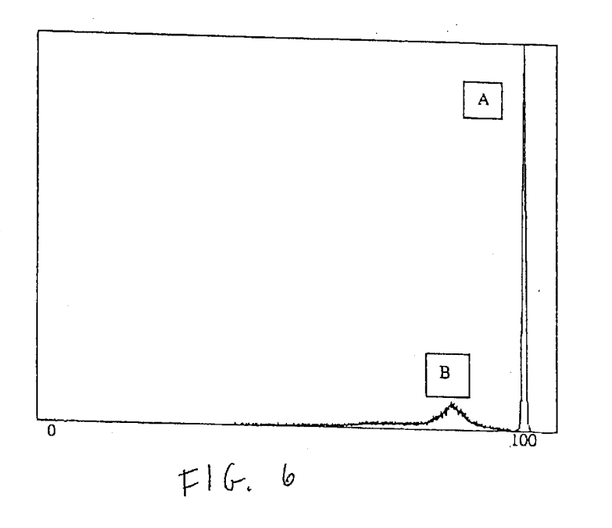
FIG. 6 illustrates an exemplary electron energy distribution.

As one can see from FIG. 6, electron passage through the mask 62 introduces an energy spread change: a substantial fraction (up to 20%) of electrons lose energy due to electron-plasmon inelastic collisions. Peak A in FIG. 6 describes electrons passed through the membrane without losing energy, and its width is defined by the beam source temperature. Peak B in FIG. 6 describes electrons passed through the membrane with substantial energy losses due to inelastic collisions with the plasmons. The energy distribution shown in FIG. 6 are characteristic of electron patterning masks, where membrane thickness is smaller than electron mean free path, such as SCALPEL™ mask structures.

The data shown in FIG. 6 can be processed by simulation software developed to compute electron trajectories from the launch point through a projection column (in FIG. 5, the projection doublet 66, 68) down to the wafer 64 plane. Due to $3^{rd}$ and $5^{th}$ order geometrical aberrations of the lenses in FIG. 5, the image in the Gaussian plane 72 is no longer a point. Analysis has shown that chromatic and spherical aberrations are the most significant aberrations (axial object—axial image). These aberrations create trajectories spread around a central point representing the Gaussian image, and PSF analysis can be used to estimate focus quality as "rise distance", or steepness, of the trajectories' distribution about axis. It has been shown that PSF rise distance defines beam blur, or minimum resolvable feature size at the wafer 64.

It is well known in the art that magnetic and electrostatic lenses alike exert different focusing action on electrons having different energy. This effect is called chromatic aberration, and it means that electrons launched from the same axial point but having different energies will not be focused into a point in the image space, but instead cross the axis in different points, thus creating a circle of confusion at the ideal, or Gaussian image plane. In other words, chromatic aberration transforms a point object into a two-dimensional image. The same is true in reference to the electrons launched with different angles to the axis: magnetic and electrostatic lenses alike will focus larger angle electrons closer to the lens plane than small angle ones, thus creating circle of confusion at the ideal, or Gaussian image plane. In other words, spherical aberration also transforms a point object into a two-dimensional image.

The chromatic and spherical aberrations are described independently in terms of resulting circle of confusion or blur, a rough estimate of which can be obtained using a quadrature sum of individual circles of confusion diameters:

$$Dconf \sim (Dchr^2 + Dsh^2)^{0.5}$$

As stated above, PSF analysis computes actual electrons' distribution—blur—at any given plane to estimate how close this distribution comes to the ideal, point-like Gaussian image.

PSF analysis may be used to find the plane in the image space where a circle of confusion reaches its minimum; the search criteria may be chosen as a radial distance between the boundaries drawn in such a manner that one of them represents 12% of total number of electrons launched, and another represents 88% of total number of electrons launched (12/88 criteria). The same procedure can be repeated for boundaries corresponding to 20% and 80% of total number of electrons launched (20/80 criteria). Conventional modeling results for 12/88, taking into account spherical aberration only, are shown in FIG. 7.

Figure 7:
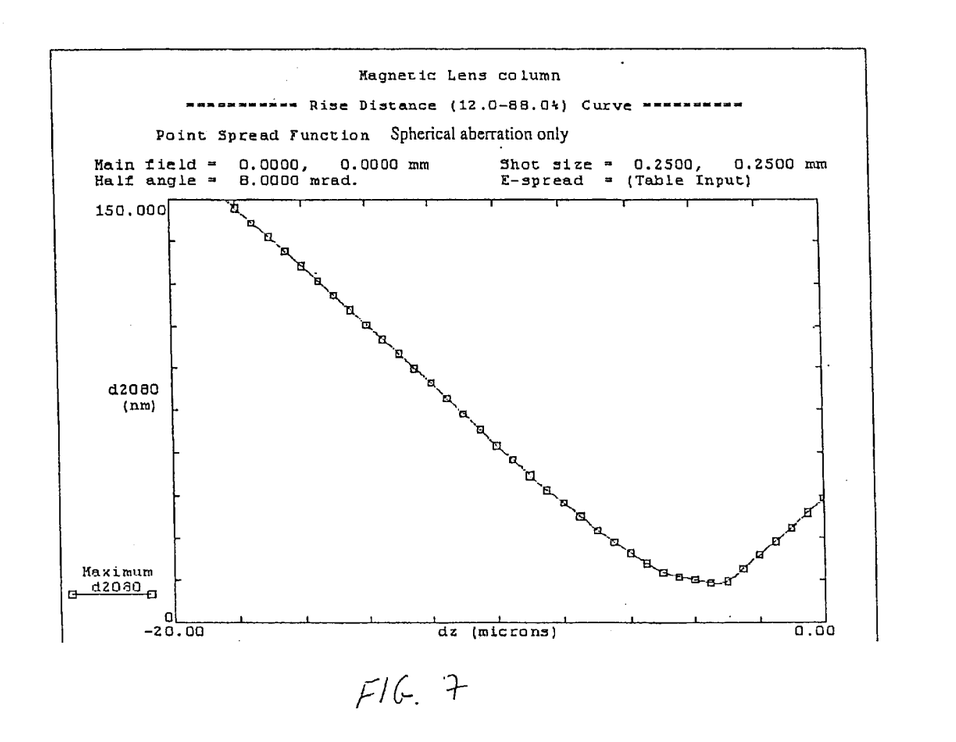
FIGS. 7–8 illustrate a point spread function, taking into account only spherical aberrations.

As one can see from FIG. 7, beam blur at the Gaussian plane (0.00 on the horizontal-axis) reaches 45 nm, while 4 microns in front of the Gaussian plane (−4.00 on the horizontal-axis), the beam blur reaches its minimum at about 15 nm (14.528 nm). In other words, focus is best in the Z=−4 micron plane.

Figure 8:
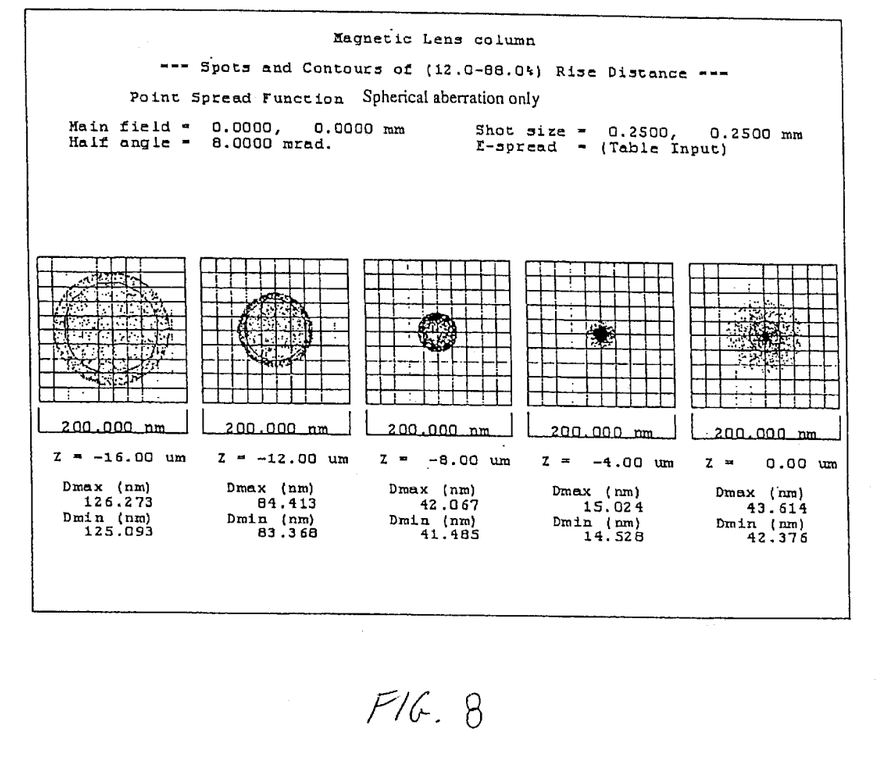

The best focus plane location is also illustrated in FIG. 8, where a beam cross-section corresponding to FIG. 7 is shown. Again, focus is best in the Z=−4 micron plane.

Figure 9:
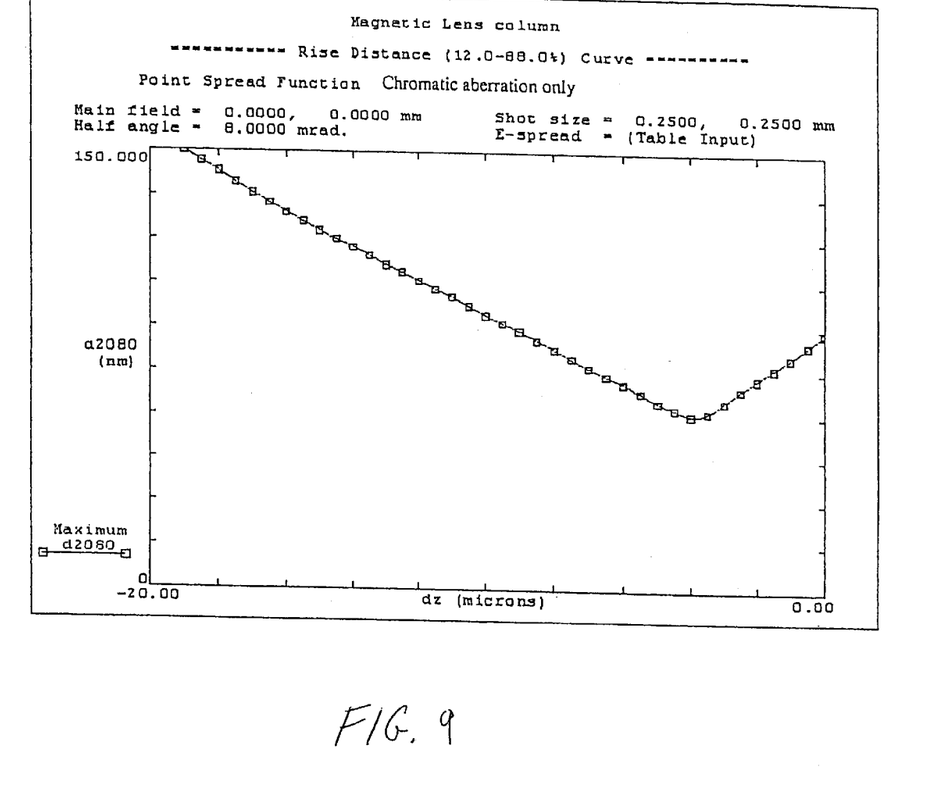
FIGS. 9–10 illustrate a point spread function, taking into account only chromatic aberrations.
Figure 10:
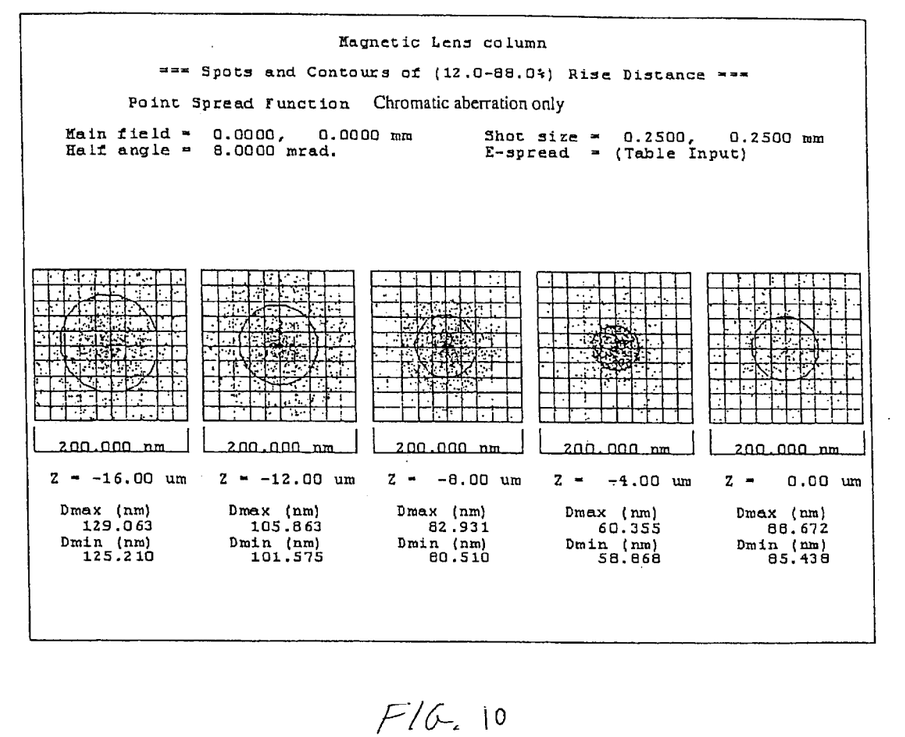

Likewise, when chromatic aberration only is taken into account, focus quality worsens due to a large fraction of slow electrons in the beam. This is illustrated in FIG. 9. Again, the best focus plane is located in 4 microns in front of the Gaussian plane. The corresponding beam cross-section profiles are shown in FIG. 10. As illustrated in FIG. 10, the minimum beam blur estimated as PSF rise distance is at about 60 nm (58.868 nm). The arrangements illustrated in FIGS. 7–10, which account for either spherical aberration only or chromatic aberration only do not accurately locate the best focus plane.

SUMMARY OF THE INVENTION

The present invention is directed to an apparatus for performing electron patterning and a method of focusing, wherein spherical aberrations are combined with chromatic aberrations, in order to lessen the negative effect of the chromatic aberrations. In one embodiment, the apparatus includes a source, a mask, a projection column, and a wafer on which the electron beam is to be focused, wherein the wafer is located in a plane where spherical aberrations of the projection column reduce negative defocusing effect caused by chromatic aberrations in the projection column. In another embodiment, the present invention is directed to a method of focussing where the spherical aberrations of the projection column reduce a negative defocusing effect caused by chromatic aberrations in the projection column.

DETAILED DESCRIPTION OF THE PRESENT INVENTION

Figure 11:
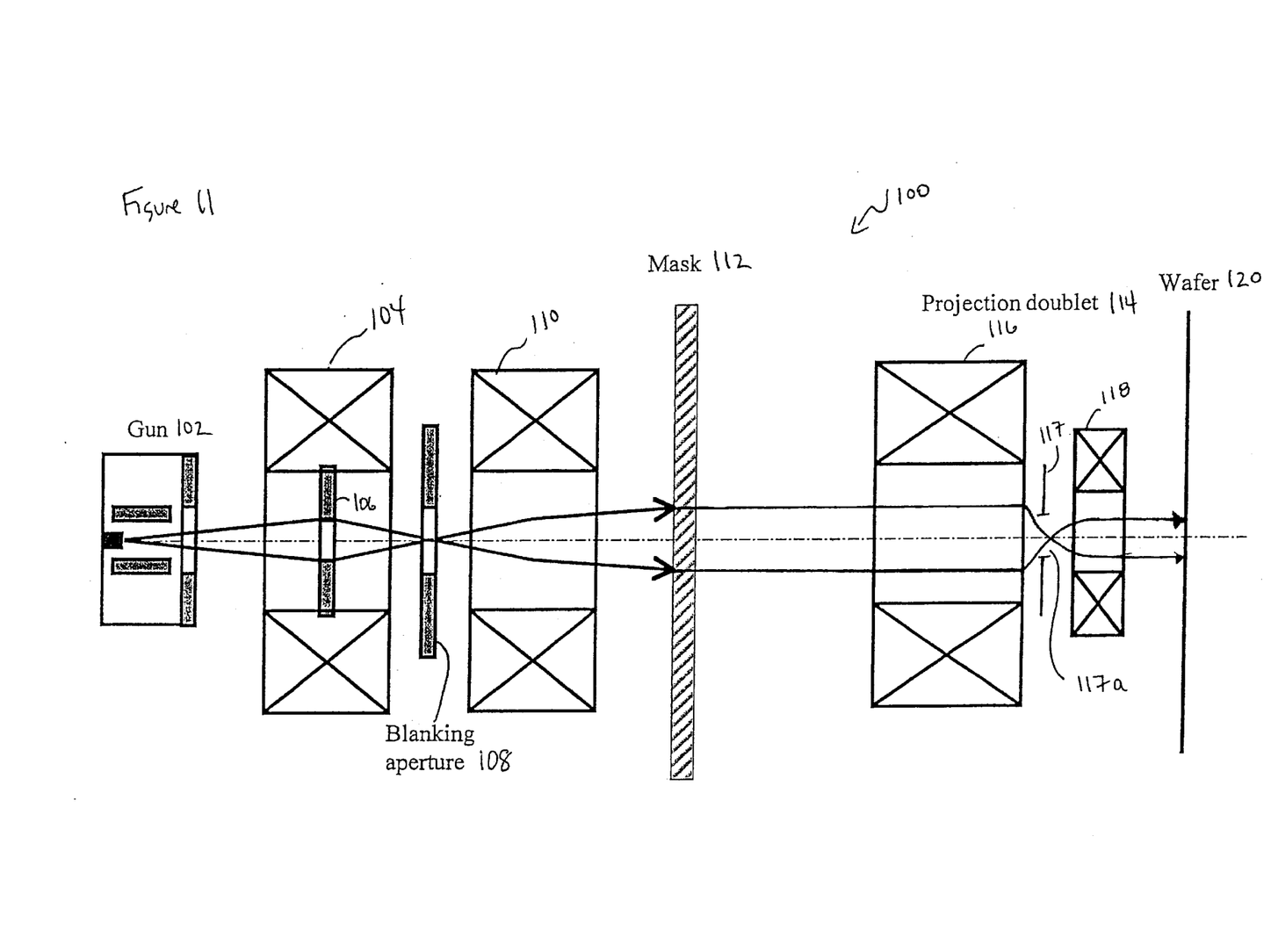
FIG. 11 illustrates an electron patterning system in one exemplary embodiment of the present invention.
Figure 12:
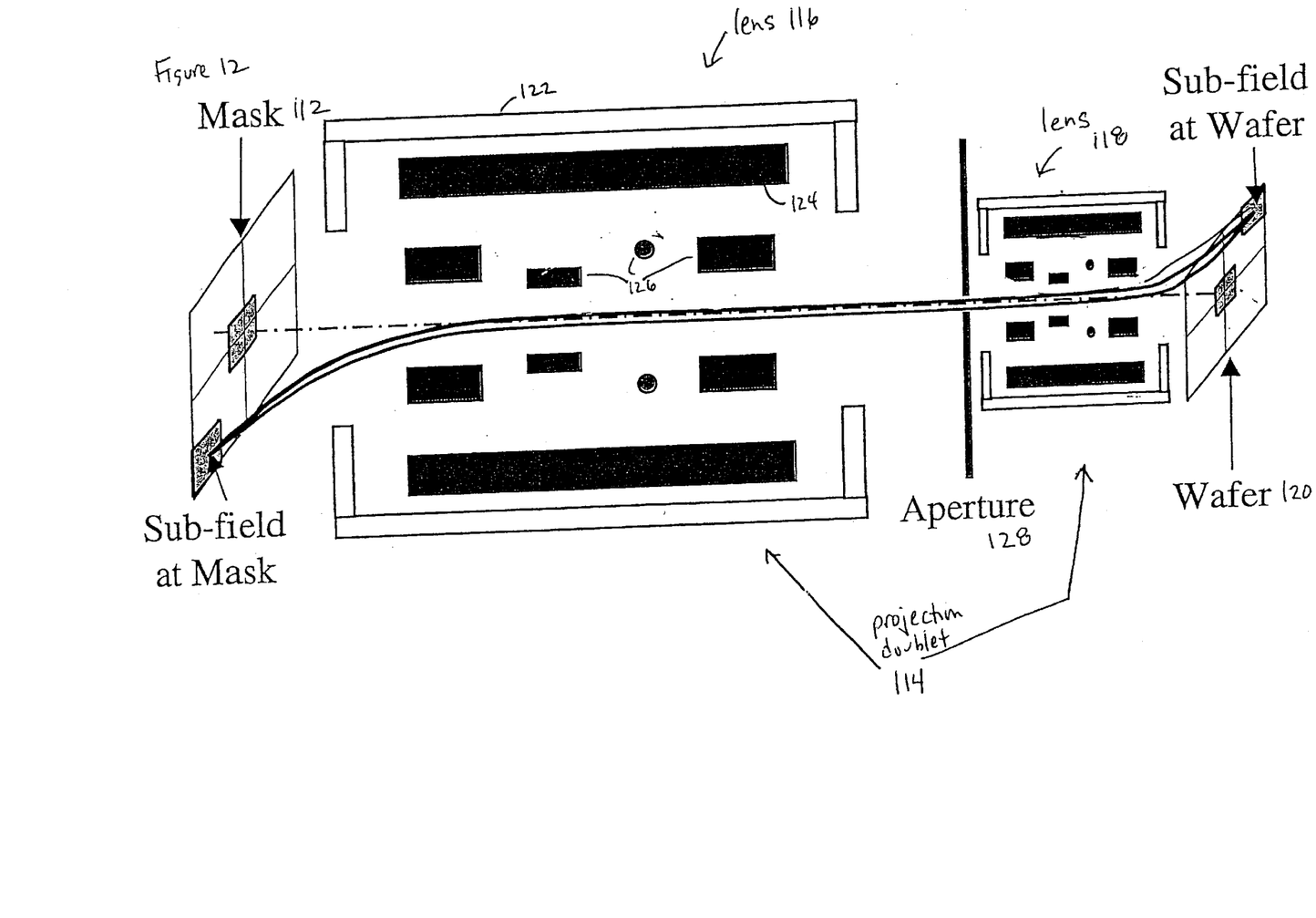
FIG. 12 illustrates the mask, the projection doublet, and the wafer of FIG. 11 in more detail.

FIG. 11 illustrates an exemplary embodiment of an electron patterning system 100 of the present invention in one embodiment. The electron patterning system 100 may include a gun 102, a first lens system 104 (with an optical shaping aperture 106 at mid-plane), a blanking aperture 108, a second lens system 110, a mask 112, a projection doublet 114, including two lenses 116, 118 and a back focal plane 117 (with aperture 117a), and a wafer 120. FIG. 12 illustrates the mask 112, the projection doublet 114, and a wafer 120 in more detail. In particular, the lens 116 may include a magnetic shell 122, windings 124, and at least one deflector 126. An aperture 128 may be placed between the two lenses 116, 118. FIG. 12 also illustrates the relationship between the sub-field at the mask 112 and the sub-field at the wafer 120.

Figure 13:
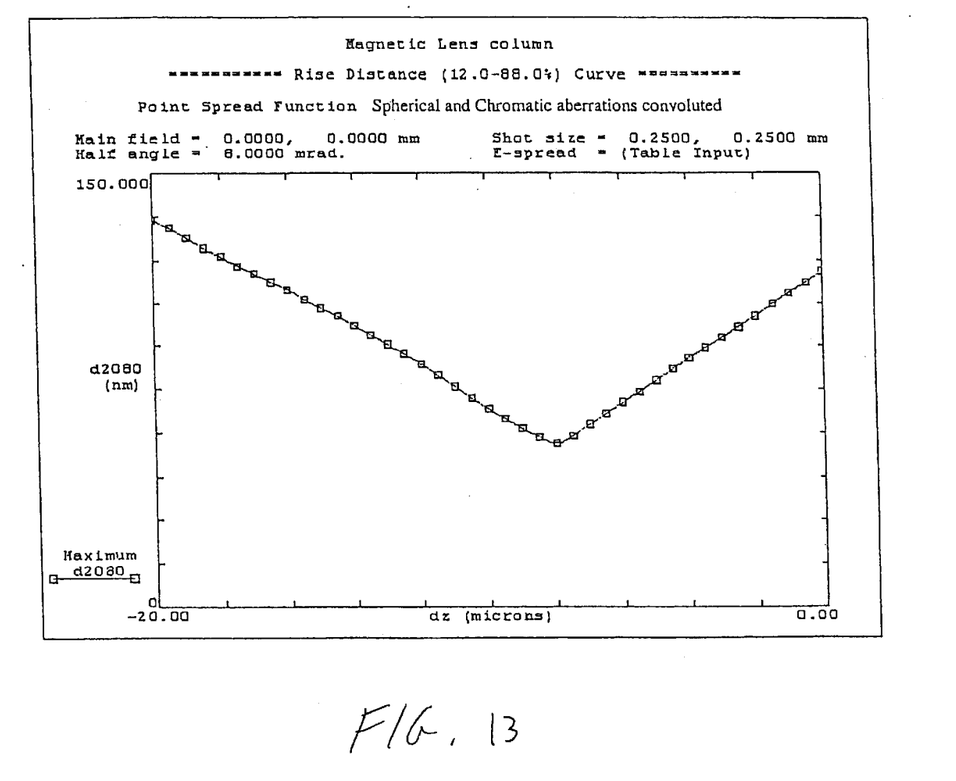
FIGS. 13–14 illustrate a point spread function, taking into account the combined effect of both spherical and chromatic aberrations.

As discussed above with respect to FIG. 5, the goal is to place the wafer 120 of FIG. 11 in the plane where the image will be best focused. As outlined above, conventional techniques for determining the best focus image plane 74 include analyzing and reducing spherical and chromatic aberrations separately. However, in order to find the best focus image plane 74, in an arrangement such as the arrangement of FIG. 11, it is necessary to consider the combined effect of the spherical and chromatic aberrations. For the arrangements illustrated in FIG. 11 (and also FIG. 5), the location of the best focus image plane 74 is actually at a location other than where both the spherical and chromatic aberrations separately, are reduced. This is illustrated in FIG. 13, which shows the combined effect of the spherical and chromatic aberrations. As illustrated in FIG. 13, beam blur at the Gaussian plane (0.00 on the horizontal axis) almost reaches 120 nm, while 8 µm in front of the Gaussian plane (−8.00 on the horizontal axis), the beam blur reaches its minimum of approximately 56 nm (55.302 nm). In other words, focus is best in the Z=−8 µm plane.

Figure 14:
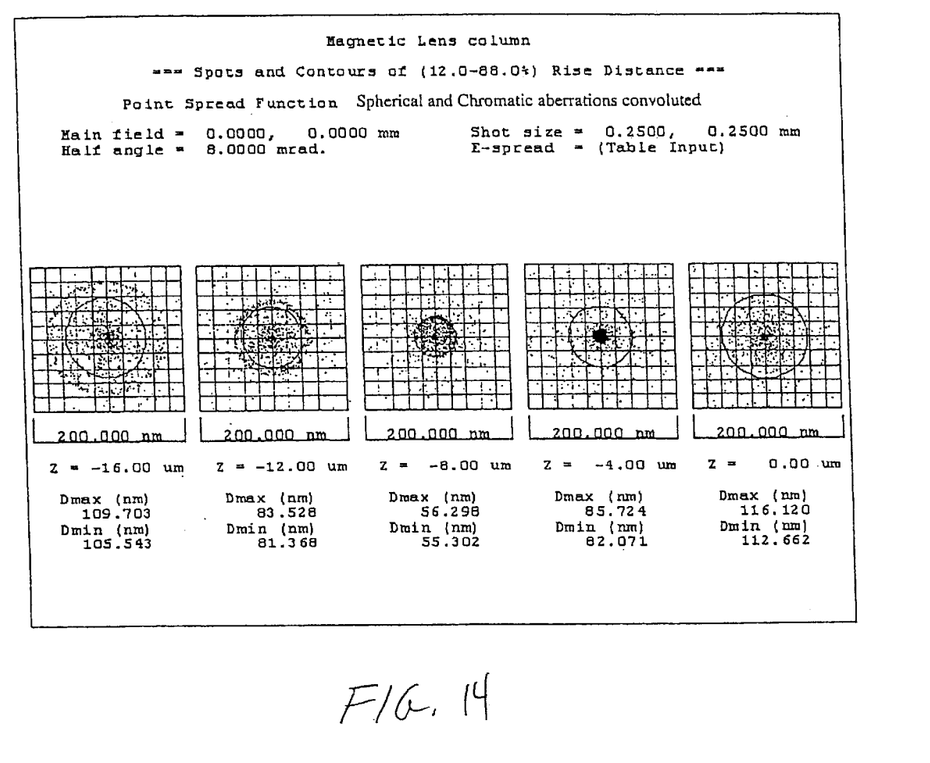

The best focus plane 74 location is also illustrated in FIG. 14, where a beam cross-section corresponding to FIG. 13 is shown. Again, focus is best in the Z=−8 µm plane.

These results, obtained by comprehensive electron trajectories analysis, appear nconventional: adding spherical aberration decreases the beam blur induced by chromatic aberration. One reason is the above-mentioned unique electron energy distributions induced by the mask 112; in particular the beam passing through the mask 112 becomes essentially a sum of two sub-beams—a fast sub-beam and slow sub-beam. The effect of chromatic aberration on such a beam creates two distinctive focal points, for the slow and fast sub-beams, respectively. Under these circumstances, spherical aberration becomes a positive factor, re-distributing electrons between the two focal points and creating a single plane of the best focus—minimum beam blur. In conventional electron beam lithography tools, spherical aberration has always been considered a negative factor, increasing beam blur and decreasing tool resolution. However, in the above arrangement, spherical aberration helps to decrease total beam blur and improve tool resolution.

As discussed above, the common conclusion drawn from conventional art FIGS. 5–10 is that the projection column's best focus plane 74 is located 4 microns in front of the Gaussian plane 72, and beam minimum blur is $(15^2+60^2)^{0.5}=62$ nm. However, as outlined above, the best focus plane 74 is in fact not located 4 microns in front of the Gaussian plane 72. This is due to the interaction between the spherical and chromatic aberration, the joint effect of these two aberrations actually placing the best focus plane 74 at a location other than the best focus plane for each of the aberrations individually.

As shown in connection with FIGS. 11–14, the wafer should be placed in the front of the Gaussian plane, closer to the projection column or optics than a best focus plane for each of the aberrations individually.

Figure 15A:
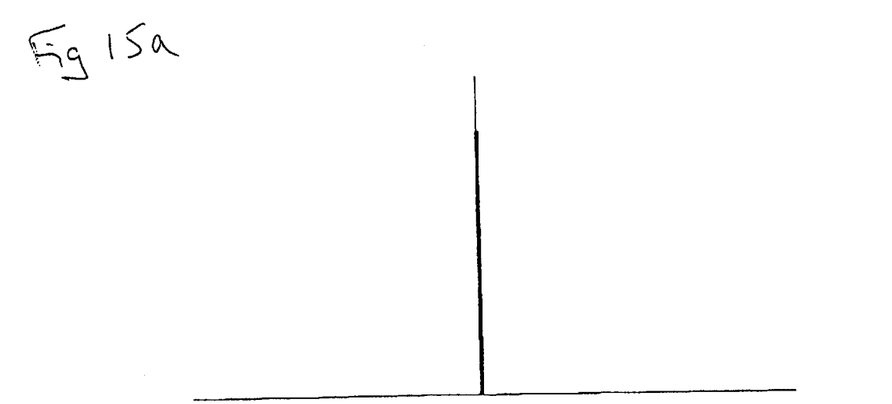
FIGS. 15a–15c illustrate the general relationship between a point spread function and lens aberrations.
Figure 15B:
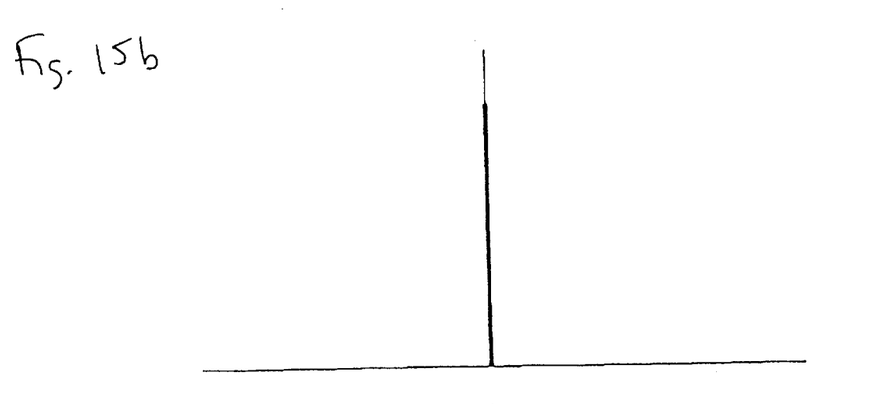
Figure 15C:
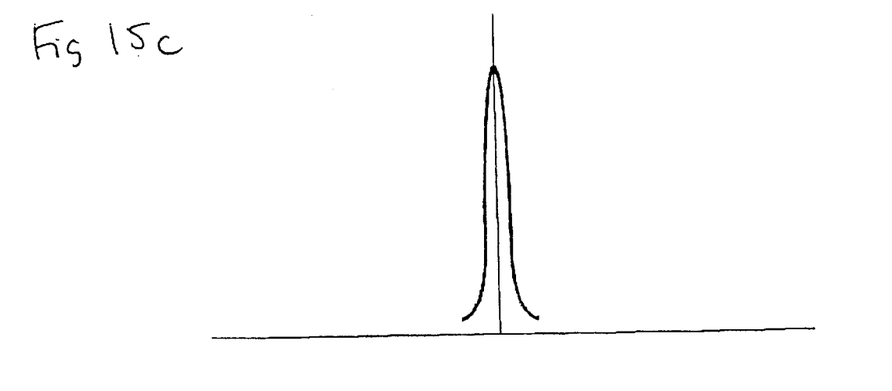
Figure 16A:
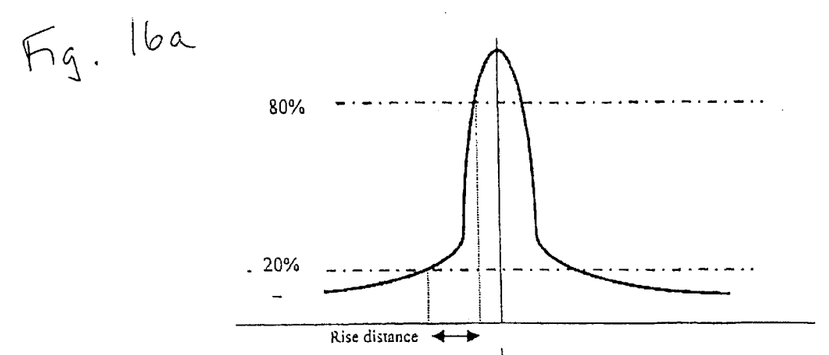
FIGS. 16a–16c illustrate how spherical aberrations, combined with chromatic aberrations, changes the shape of the point spread function to improve focusing of an electron patterning system.
Figure 16B:
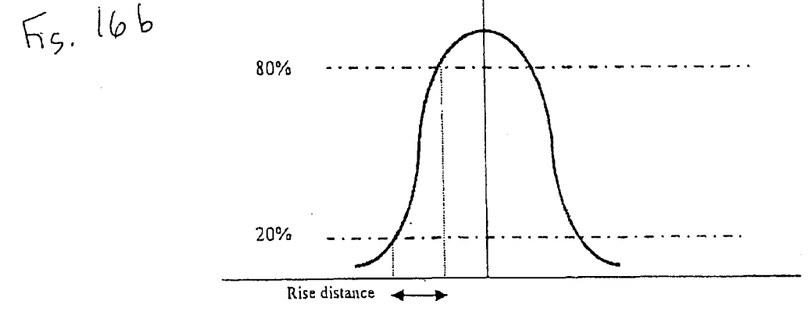
Figure 16C:
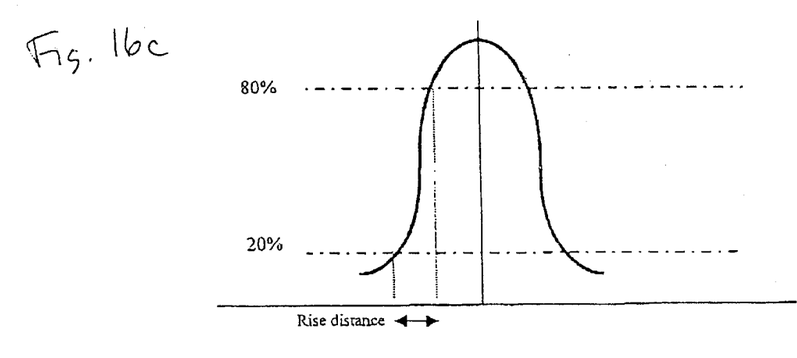

FIGS. 15–16 explain the interaction between the spherical and chromatic aberrations identified above. FIGS. 15a–15c illustrates the general relationship between PSF and lens aberrations. FIG. 15a illustrates a PSF at the object plane, FIG. 15b illustrates the PSF at the image plane, with an ideal lens, lens doublet, or projection column, with no aberrations, and FIG. 15c illustrates the PSF at the image plane, including an actual lens, lens doublet, or projection column, with aberrations. FIG. 16a illustrates a PSF broaden by spherical aberration only (using the 20/80 criteria). FIG. 16b illustrates PSF broadening by chromatic aberration only (also using the 20/80 criteria). Finally, FIG. 16c illustrates the PSF broadening including the joint action of the spherical and chromatic aberrations (also using the 20/80 criteria). The addition of the spherical aberration to the chromatic aberration results in a shorter 20/80 rise distance, as a result of PSF curve reshaping. As illustrated in FIGS. 16a–16c the addition of the spherical aberration to the chromatic aberration shapes the PSF in such a way that the slope is steeper in the 20/80 range, which results in an improvement of the lithographic result for the electron beam lithography tool.

The present invention may be implemented as follows. First an analysis, similar to the analysis performed above in conjunction with FIGS. 9–10, is performed to determine the best focus plane, considering chromatic aberrations only. Then the effect of spherical aberrations can be introduced until the best focus plane, considering the combined effect of spherical and chromatic aberrations, is obtained, as illustrated in FIGS. 13–14. The wafer is then located at this new best focus plane.

While electrons energies distribution after passing through the mask 112 are independent of the system, a spherical aberration coefficient of the projection doublet 116, 118 may be varied by lens design means within a range from 5 mm up to 150 mm. Simulation shows preferred spherical aberration coefficient ranges within 5 to 100 mm. When within this range, spherical aberration helps to decrease beam blur induced by the relatively powerful chromatic aberration.

It is noted that the present invention has been described above in conjunction with FIG. 11. However, the principles of the present invention may also be applied to the conventional systems illustrates in FIGS. 1, 2, and 5, or any other system which generally includes an electron source, a mask or membrane, a projection column, and a location where a source beam are to be focused. In particular, FIG. 11 describes a gun 102, however, the electron source may be any type of conventional electron source. Further, FIG. 11 illustrates a first lens system 104, a blanking aperture 108, and a second lens system 110, however, these elements are not necessary. Further, although FIG. 11 illustrates a mask 112, the mask may be replaced by any similar element, such as a membrane. Further, although FIG. 11 illustrates a projection doublet 114 including lens 116, lens 118 and a back focal plane 117 (with aperture 117a), the projection doublet 114 may be replaced with any number of lenses and other optical elements. Further, although in FIG. 11, the goal is to focus the electrons on the wafer 120, the electrons may be focused in any plane on any element, and not necessarily on a wafer. Further, although the exemplary implementation described above begins with the effect of chromatic aberration only and then considers the effect of spherical aberrations, an alternative implementation could reverse this order.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus, comprising:
    a source for producing an electron beam;
    a mask, through which the electron beam passes;
    a projection column through which the electron beam passes; the projection colimn having a spherical aberration coefficient and a plane where a spherical aberration of the projection column reduces a negative defocusing effect caused by chromatic aberrations in the projection column; and
    a wafer on which the electron beam is to be focused in the plane.

2. The apparatus of claim 1, wherein the spherical aberration coefficient of the projection column is 5–150 mm.

3. The apparatus of claim 1, wherein the plane is 4–20 nm closer to the projection column than an image plane determined based on chromatic aberrations only.

4. The apparatus of claim 1, wherein said apparatus is part of an electron patterning tool where a thickness of the mask is smaller than an electron mean free path of the electron patterning tool.

5. The apparatus of claim 4, wherein the electron patterning tool is a SCALPEL™ electron patterning tool.

6. The apparatus of claim 1, wherein the projection column includes at least one lens.

7. The apparatus of claim 6, wherein the projection column includes at least a projection doublet.

8. The apparatus of claim 2, wherein the spherical aberration coefficient of the projection column is 5–100 mm.

9. The apparatus of claim 2, wherein the projection column includes at least one lens.

10. The apparatus of claim 9, wherein the projection column includes at least a projection doublet.

* * * * *